US006771728B1

(12) United States Patent
Abernathy

(10) Patent No.: US 6,771,728 B1
(45) Date of Patent: Aug. 3, 2004

(54) HALF-RATE PHASE DETECTOR WITH REDUCED TIMING REQUIREMENTS

(75) Inventor: Brian Lee Abernathy, Poway, CA (US)

(73) Assignee: Applied Micro Circuits Corporation, San Diego, CA (US)

(*) Notice: Subject to any disclaimer, the term of this patent is extended or adjusted under 35 U.S.C. 154(b) by 719 days.

(21) Appl. No.: 09/665,929

(22) Filed: Sep. 20, 2000

(51) Int. Cl.$^7$ ............................................... H04L 25/00

(52) U.S. Cl. ..................... 375/371; 375/376; 375/226; 375/354

(58) Field of Search ................................ 375/360, 375, 375/371, 226, 376; 331/1 A

(56) References Cited

U.S. PATENT DOCUMENTS

| 4,535,459 A | | 8/1985 | Hogge, Jr. | |
|---|---|---|---|---|
| 5,592,125 A | * | 1/1997 | Williams | 331/1 A |
| 5,799,048 A | * | 8/1998 | Farjad-Rad et al. | 375/360 |
| 6,151,356 A | * | 11/2000 | Spagnoletti et al. | 375/375 |

OTHER PUBLICATIONS

Müllner, Ernst, "A 20 Gbit/s Parallel Phase Detector and Demultiplexer Circuit in a Production Silicon Bipolar Technology with $f_t$=25 GHz", IEEE BCTM 2.2, Date unknown, pp. 43–46, Publisher unknown.

Hogge, Charles R., "A Self Correcting Clock Recovery Circuit", Journal of Lightwave Technology, Dec. 1985, vol. LT-3, pp. 1312–1314, Publisher unknown.

* cited by examiner

Primary Examiner—Shuwang Liu
Assistant Examiner—Eva Zheng
(74) Attorney, Agent, or Firm—INCAPLAW; Terrance A. Meador

(57) ABSTRACT

A digital phase detector in accordance with the present invention is capable of stable high speed operation. The phase detector operates in a half-rate manner, i.e., the digital clock frequency is one-half the digital data rate. A phase adjustment signal is generated with digital logic elements in a manner that reduces the timing requirements of the digital devices. The phase adjustment signal contains phase reference pulses having pulsewidths that are greater than or equal to the pulsewidth associated with the digital clock signal. The use of relatively wide phase reference pulses reduces the likelihood of instability and erroneous detection due to circuit speed limitations, thus resulting in an overall increase in detector performance.

23 Claims, 4 Drawing Sheets

HALF-RATE PHASE DETECTOR WITH REDUCED TIMING REQUIREMENTS

FIELD OF THE INVENTION

The present invention relates generally to digital phase detector circuits. More particularly, the present invention relates to a digital phase detector circuit capable of stable operation at relatively high frequencies.

BACKGROUND OF THE INVENTION

The prior art is replete with digital phase detector designs and various applications for such designs. Phase detectors are commonly used in phase locked loop (PLL) circuits to synchronize a received digital data signal to a digital clock signal. PLL circuits are often used in digital data communication systems.

FIG. 1 depicts a basic PLL circuit 100. PLL circuit 100 includes a phase detector 102, which receives a digital data input signal and generates a digital data output signal. Phase detector 102 also receives a digital clock signal and generates a phase output signal and a reference output signal. The phase output signal is generated in response to the timing offset between the incoming data signal and the clock signal. PLL circuit 100 employs a filtering and integrating circuit 104 for the phase output signal and a filtering and integrating circuit 106 for the reference output signal. The processed phase and reference output signals are combined in a summer 108 and the combined signal is used as a control signal for a voltage controlled oscillator (VCO) 110. The VCO 110 produces the clock signal, and the frequency of the clock signal is varied by the VCO 110 in an attempt to optimize the alignment between the data signal and the clock signal.

One well known phase detector circuit is disclosed in U.S. Pat. No. 4,535,459, issued Aug. 13, 1985 to Hogge. FIG. 2 is a schematic representation of the fundamental Hogge detector circuit elements. The Hogge detector generally includes a first latch 202 connected in series with a second latch 204. Latch 202 receives the digital input signal and a clock signal. Latch 204 receives the output of latch 202 and an inverse clock signal. The phase output is generated by a first exclusive OR (XOR) gate 206 and the reference output signal is generated by a second XOR gate 208.

FIG. 3 illustrates various signals associated with the Hogge detector shown in FIG. 2. Several transition edges are duplicated in FIG. 3 to represent different phase possibilities associated with the incoming data and the different phase possibilities associated with data passed through a practical latch. FIG. 3 depicts a condition where the clock signal 304 is early with respect to the data signal 302. In response to this condition, the Hogge detector generates relatively narrow pulses for the phase output signal 306. Depending upon the alignment between the data signal and the clock signal, the pulses in the phase output signal 306 become wider or narrower.

The relatively narrow pulses generated by the Hogge detector can be problematic in high speed applications (e.g., 10 Gbps data rate). As mentioned above, the reference output pulses may approach a zero width as the transition edges of the data signal approach the transition edges of the clock signal. Practical devices become nonlinear and may fail under such conditions. Consequently, the phase output signal may be erroneously generated or the PLL may become unstable.

In addition, the Hogge detector requires a digital clock having a frequency equal to the bit rate of the incoming digital data stream. For example, if the incoming digital data is transmitted at 10 kbps, then the Hogge detector must use a digital clock having a nominal frequency of 10 kHz. This constraint requires higher frequency oscillators and clock drivers, which in turn requires more operating power.

Another prior art phase detector, which leverages the fundamental Hogge design, employs a digital clock having a nominal frequency that is one-half the bit rate of the digital input signal. Thus, a 20 Gbps digital input signal can be processed using a 10 GHz digital clock. Although this type of phase detector relaxes the clock frequency requirement, it generates relatively narrow pulses for the phase output signal (in the same manner as the Hogge detector). Accordingly, this type of phase detector suffers from the same practical shortcomings as the conventional Hogge detector.

SUMMARY OF THE INVENTION

The present invention provides a digital phase detector circuit that is suitable for use in high speed applications. The present invention also provides a synchronization method associated with a received digital data signal. The phase detector utilizes a digital clock having a frequency that is one-half the data rate of the input signal. Furthermore, the phase detector is capable of stable operation under a variety of clock-to-data alignment conditions. Thus, the phase detector can be realized with practical digital devices having reduced timing requirements and lower speed ratings relative to the digital devices used in prior art detectors.

The above and other aspects of the present invention may be carried out in one form by a digital synchronization method. The method involves receiving a digital input signal comprising an input data pulse with a low-to-high transition edge and a high-to-low transition edge, receiving a digital clock signal comprising a clock pulse having a low-to-high transition edge and a high-to-low transition edge, and generating a phase reference component signal comprising a phase reference pulse having a low-to-high transition edge substantially aligned with the low-to-high transition edge of the input data pulse, and having a high-to-low transition edge substantially aligned with the high-to-low transition edge of the clock pulse.

BRIEF DESCRIPTION OF THE DRAWINGS

A more complete understanding of the present invention may be derived by referring to the detailed description and claims when considered in conjunction with the following Figures, wherein like reference numbers refer to similar elements throughout the Figures.

DETAILED DESCRIPTION OF A PREFERRED EMBODIMENT

The present invention may be described herein in terms of functional block components and various processing steps.

It should be appreciated that such functional blocks may be realized by any number of hardware components configured to perform the specified functions. In addition, those skilled in the art will appreciate that the present invention may be practiced in conjunction with any number of data communication applications and that the system described herein is merely an example of one practical application.

It should be appreciated that the particular implementations shown and described herein are illustrative of the invention and its best mode and are not intended to otherwise limit the scope of the invention in any way. Indeed, for the sake of brevity, conventional techniques for digital data processing, data transmission, and other functional aspects of the circuits (and individual elements of the circuits) may not be described in detail herein. Furthermore, the connecting lines shown in the various figures contained herein are intended to represent exemplary functional relationships and/or physical couplings between the various elements. It should be noted that many alternative or additional functional relationships or physical connections may be present in a practical embodiment.

Figure 4:
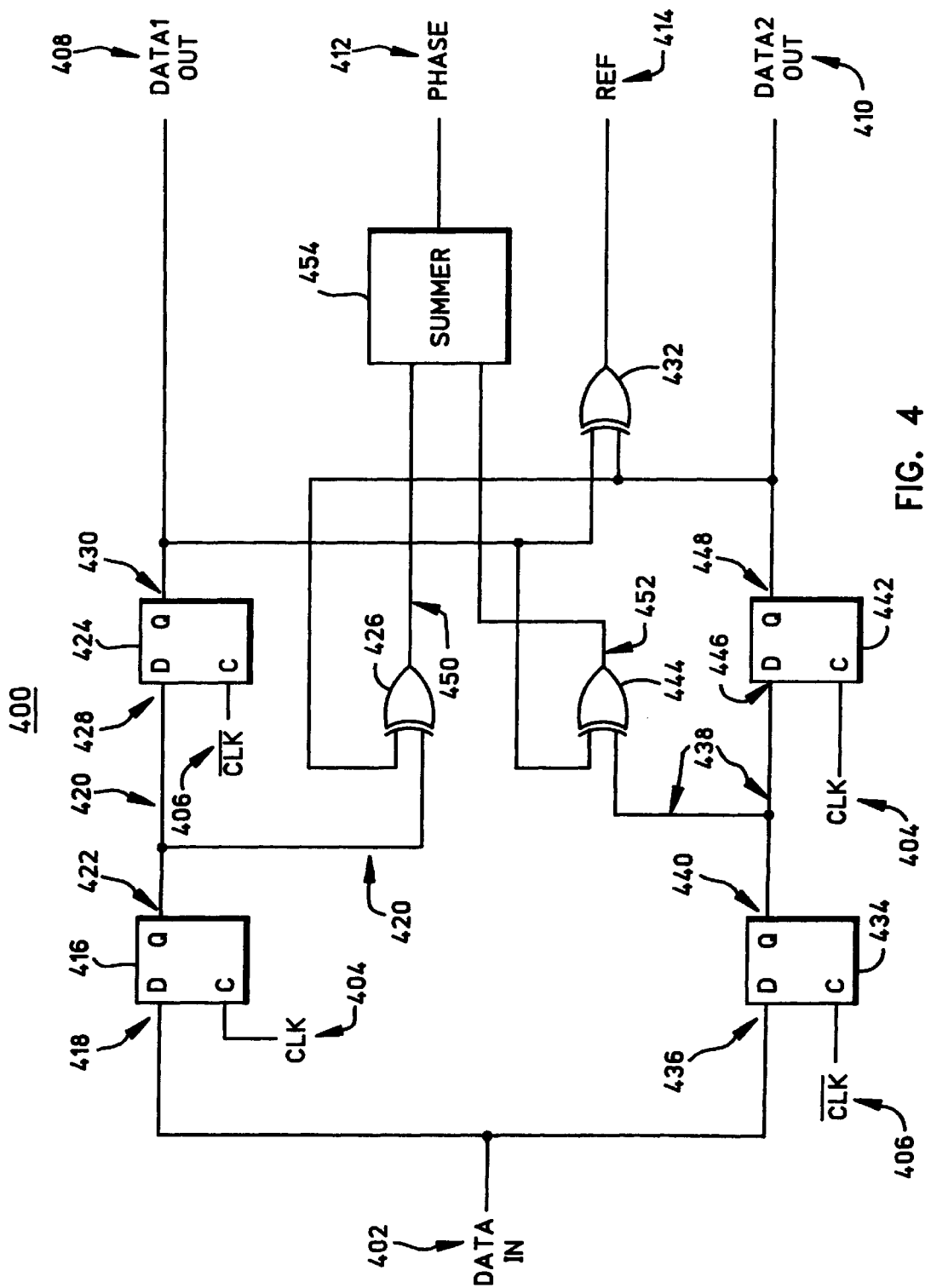
FIG. 4 is a schematic representation of a phase detector circuit according to the present invention.

FIG. 4 is a schematic representation of a phase detector circuit 400 configured in accordance with the present invention. Phase detector circuit 400 may be utilized in a phase locked loop (PLL) circuit such as PLL circuit 100 (see FIG. 1). In accordance with a preferred practical embodiment, phase detector circuit 400 receives a digital input signal 402, a digital clock signal 404, and an inverse digital clock signal 406 (which may be derived from the digital clock signal). Phase detector circuit 400 generates a first data output signal 408 and a second data output signal 410. In accordance with known techniques, the first data output signal 408 may be associated with "even" input bits and the second data output signal 410 may be associated with "odd" input bits. In addition, the bit rates of the first and second data output signals 408 and 410 are one-half the bit rate of the digital input signal 402. The first and second data output signals 408 and 410 are used in accordance with the particular application.

In a preferred practical embodiment, the input, output, and clock signals associated with phase detector circuit 400 are differential in nature. For the sake of convenience and clarity, FIG. 4 depicts signal flow connections as single lines, which may represent a combination of positive and negative signals.

Figure 1:
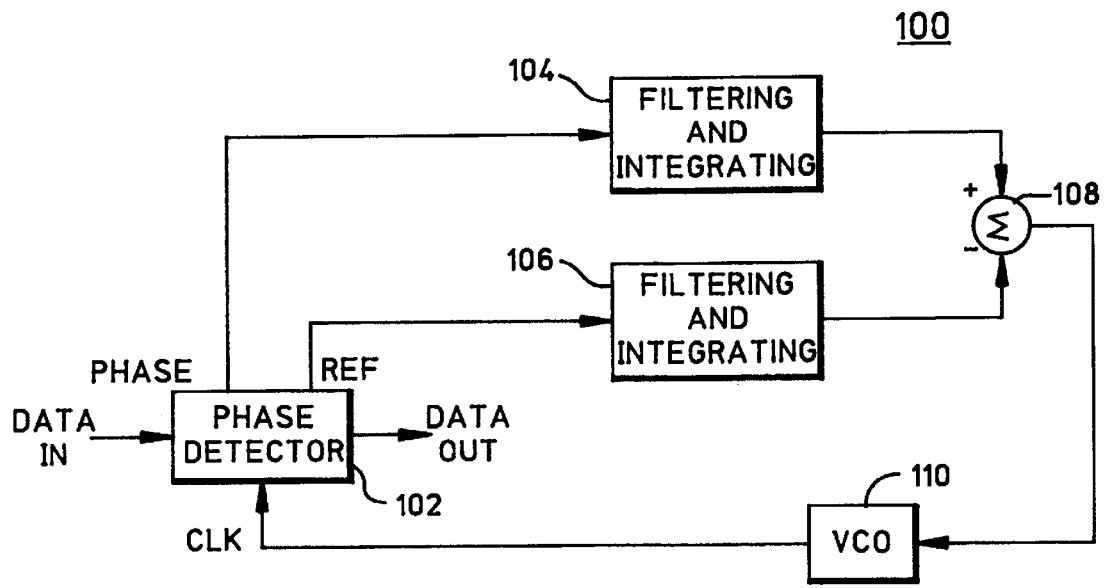
FIG. 1 is a schematic representation of a general phase locked loop-circuit.
Figure 2:
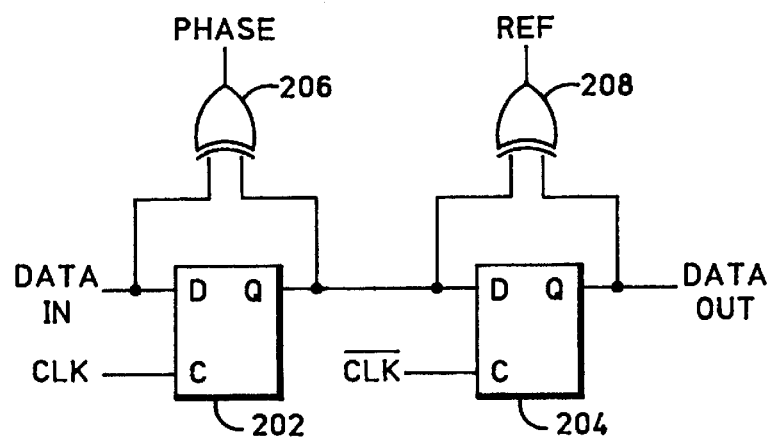
FIG. 2 is a schematic representation of a prior art Hogge phase detector circuit.
Figure 3:
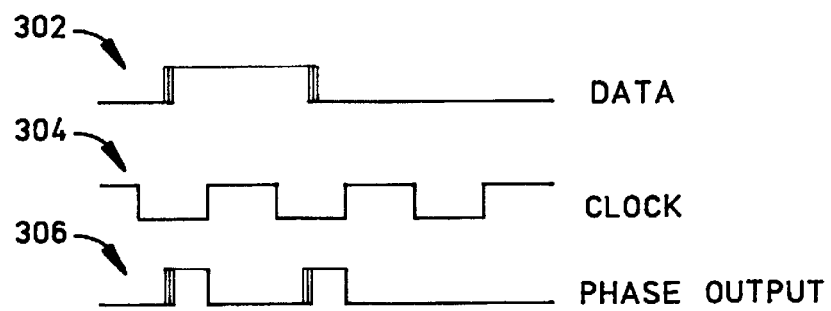
FIG. 3 illustrates timing diagrams for various signals associated with a Hogge phase detector circuit.

Phase detector circuit 400 generates a phase adjustment signal 412 and a reference signal 414. As shown in FIG. 1, these signals may be further processed and combined to produce a voltage controlled oscillator (VCO) control signal. The phase adjustment signal 412 contains information related to the alignment between the digital input signal and the digital clock signal. Thus, if the input and clock signals are adequately aligned (e.g., to within a suitable tolerance for purposes of the specific application), then the VCO 110 will maintain the current clock frequency. If the input and clock signals become misaligned, then the phase adjustment signal 412 will contain more or less energy, thus causing the VCO control signal to vary. Consequently, the VCO 110 will alter the frequency of the clock signal to improve the synchronization of the circuit. In this manner, VCO 110 is associated with the generation of the digital clock signal and the inverse digital clock signal.

Phase detector circuit 400 includes a first latch 416 having a data input node 418 configured to receive the digital input signal 402. First latch 416 operates in a conventional manner (in response to the digital input signal 402 and in response to the digital clock signal 404) to generate a digital output signal 420 at a data output node 422. As shown in FIG. 4, phase detector 400 is preferably implemented with two serial latches. The operation of the latches, which is consistent with conventional latch devices, will not be described in detail herein.

In the context of a single latch device, a "node" may be equivalent to a terminal, a port, a connecting pin of a chip, or the like. However, in the context of a larger architecture, such as phase detector circuit 400, a "node" may refer to an internal point of reference, a common electrical junction, or a connection point shared between devices. In other words, phase detector circuit 400 need not have distinct physical structures associated with each input and output node.

The digital output signal 420 generated by first latch 416 is used as an input to a second latch 424 and as an input to a first exclusive OR (XOR) gate 426. Second latch 424 has an input node 428 configured to receive digital output signal 420 and an output node 430 upon which the first data output signal 408 is generated. Second latch 424 generates the first data output signal 408 in response to inverse digital clock signal 406 and in response to digital output signal 420. As described in more detail below, the first data output signal 408 is also used as an input to a third XOR gate 432.

Similarly, phase detector circuit 400 includes a third latch 434 having an input node 436 configured to receive the digital input signal 402. Third latch 434 is configured to generate a digital output signal 438 at its output node 440 in response to the digital input signal 402 and in response to the inverse digital clock signal 406. The digital output signal 438 generated by third latch 434 is used as an input to a fourth latch 442 and as an input to a second XOR gate 444. Fourth latch 442 has an input node 446 configured to receive digital output signal 438 and an output node 448 upon which the second data output signal 410 is generated. Fourth latch 442 generates the second data output signal 410 in response to digital clock signal 404 and in response to digital output signal 438. In addition, the second data output signal 410 is used as an input to third XOR gate 432.

As described above, first XOR gate 426 is configured to receive digital output signal 420 (generated by first latch 416). The second data output signal 410 (generated by fourth latch 442) serves as the other input to first XOR gate 426. Similarly, second XOR gate 444 is configured to receive digital output signal 438 (generated by third latch 434) as one input and first data output signal 408 (generated by second latch 424) as a second input. This results in a cross connection between the XOR gates that produce the phase adjustment signal. The first XOR output signal 450 and the second XOR output signal 452 are fed to a processing circuit, which is configured to generate the phase adjustment signal 412 in response to the XOR output signals 450 and 452. In the preferred embodiment, the processing circuit is realized as an analog summer 454.

Third XOR gate 432 is configured to receive the first and second data output signals 408 and 410 as inputs and to produce reference output signal 414 in response to those inputs. The characteristics of the reference output signal 414 are described in more detail below.

It should be appreciated that the latches and XOR gates described above are examples of suitable digital circuit elements configured to perform the respective operations. Alternate embodiments of the present invention may utilize different or additional circuit elements to carry out the same or equivalent functions.

The operation of phase detector circuit 400 will now be described with additional reference to FIGS. 5 and 6, which illustrate timing diagrams for various signals associated with phase detector circuit 400. In accordance with a preferred practical embodiment, phase detector circuit 400 is capable of stable operation at relatively high speeds, e.g., at digital data rates up to 20 Gbps. Phase detector circuit 400 is configured such that, for a digital input signal having a data rate equal to D bits per second, the clock signal (and the inverse clock signal) has a frequency of D/2 hertz. In other words, phase detector circuit 400 is capable of operating in a half-rate mode. For example, a clock signal having a frequency of 5 GHz can be used for an input signal having a data rate of 10 Gbps.

The digital input signal 402 is retimed by first latch 416 in response to the clock signal 404. The resulting retimed signal, i.e., signal 420, is subsequently retimed by second latch 424 in response to the inverse clock signal 406. As described above, second latch 424 generates the first data output signal 408. The digital input signal 402 is also retimed by third latch 434 in response to the inverse clock signal 406. The resulting retimed signal, i.e., signal 438, is subsequently retimed by fourth latch 442 in response to the clock signal 404. In this manner, fourth latch 442 generates the second data output signal 410.

First XOR gate 426 functions to produce a first phase reference component signal (i.e., signal 450) by processing digital output signal 420 and second data output signal 410. Similarly, second XOR gate 444 functions to produce a second phase reference component signal (i.e., signal 452) by processing digital output signal 438 and first data output signal 408. Referring to FIG. 5, the characteristics of the phase reference component signals will be described in the context of example timing diagrams.

The digital input signal may include an input data pulse 502. For purposes of this example, the duration of input data pulse 502 is one bit period. Input data pulse 502 is depicted with various phase possibilities associated with the low-to-high transition edge 504 and with the high-to-low transition edge 506. FIG. 5 depicts an early clock signal, relative to the input data signal. The clock signal includes a clock pulse 508 having a low-to-high transition edge 510 and a high-to-low transition edge 512.

The phase reference component signal produced by the respective XOR gate includes a phase reference pulse 514. The low-to-high transition edge 516 of the phase reference pulse 514 is substantially aligned with the low-to-high transition edge 504 of the input data pulse 502. The high-to-low transition edge 518 of the phase reference pulse 514 is substantially aligned with the high-to-low transition edge 512 of the clock pulse 508. Notably, the phase reference component signal is generated by the respective XOR gate such that the width of the phase reference pulse 514 is greater than or equal to the width of the input data pulse 502.

Figure 5:
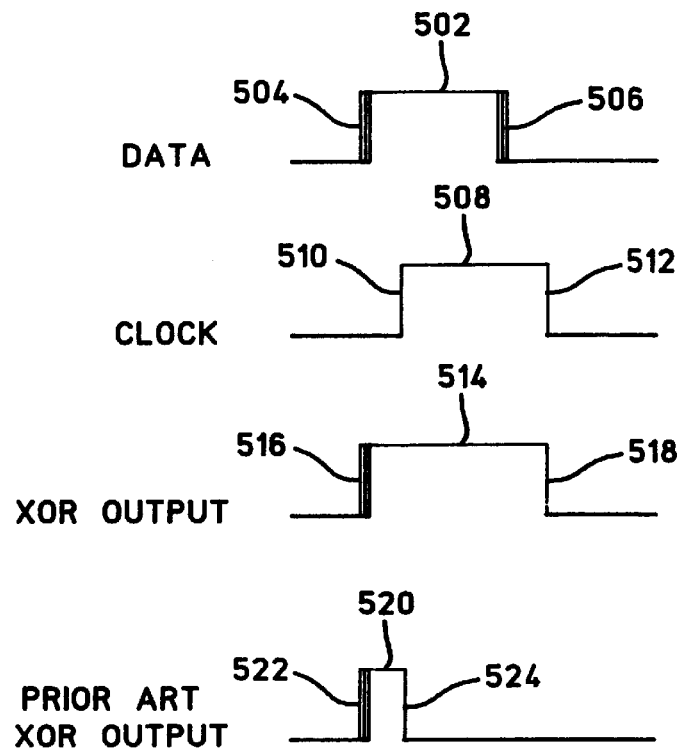
FIGS. 5–7 illustrate timing diagrams for various signals associated with a phase detector circuit according to the present invention.
Figure 6:
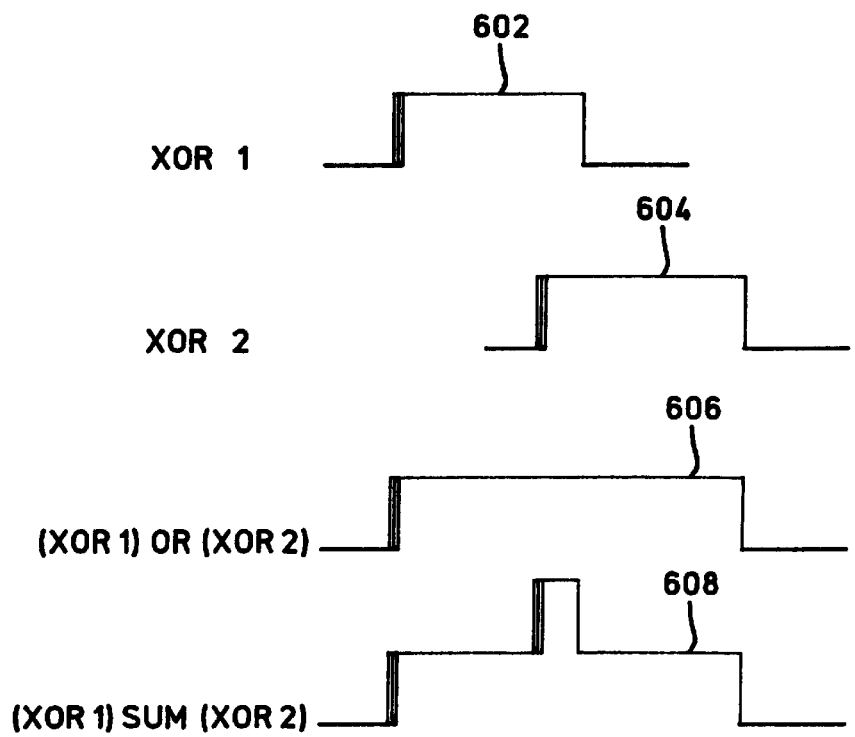

For purposes of comparison, FIG. 5 also depicts a corresponding phase reference pulse 520 generated by a Hogge detector under the same conditions. Although the low-to-high transition edge 522 of the phase reference pulse 520 is also aligned with the low-to-high transition edge 504 of the input data pulse 502, the high-to-low transition edge 524 of the phase reference pulse 520 is aligned with the low-to-high transition edge 510 of the clock pulse 508. Thus, the prior art phase reference pulse 520 is relatively narrow compared to the phase reference pulse 514 generated in accordance with the techniques of the present invention. In other words, the high-to-low transition edge 518 associated with the phase reference pulse 514 is delayed relative to the high-to-low transition edge 524 of the prior art phase reference pulse 520.

As described above, the preferred embodiment employs analog summer 454 to suitably combine the two phase reference component signals 450 and 452 into the phase adjustment signal 412. In contrast, prior art Hogge detectors employ a single XOR gate to generate the phase adjustment signal 412.

Phase detector circuit 400 utilizes analog summer 454 rather than a digital logic element (e.g., an OR gate) to accommodate the potentially wide phase reference pulses generated by first and second XOR gates 426 and 444. As described above, phase detector circuit 400 utilizes two "branches" that are 90 degrees out of phase with each other. Under certain conditions, the outputs of first and second XOR gates 426 and 444 may "overlap" each other, as depicted in FIG. 6. As shown, the output 602 of the first XOR gate and the output 604 of the second XOR gate are both logic high for a short period of time. This period is indicative of the delay between the input signal and the clock signal. This delay information would be lost if, for example, the two XOR output signals are combined in an OR gate (as depicted by the combined signal 606).

In a practical embodiment, analog summer 454 is used to drive an analog filter (not shown). Accordingly, there is no loss of information despite the potentially very narrow overlapping. The information is preserved because the filter acts as a low pass filter to average the pulses so that any small distorted pulse will be properly averaged.

To preserve the delay information, analog summer 454 is suitably configured to add the outputs of the two XOR gates. In the context of the example signals shown in FIG. 6, the output of the analog summer 454 may be characterized by the summed signal 608. The summed signal 608 includes the additional energy associated with the "overlap" of the two XOR output signals 602 and 604. In this manner, the phase adjustment signal 412 can be suitably generated to accurately reflect any alignment offset between the digital input signal and the digital clock signal.

The reference output signal 414 is produced by performing an XOR function (with third XOR gate 432) on the first and second data output signals 408 and 410. The reference output signal 414 contains fixed-width pulses that are generated whenever the digital input signal exhibits a low-to-high transition or a high-to-low transition. The duration of each reference output pulse is one bit period of the digital input signal.

In a practical embodiment, summer 454 (or an additional circuit element) may be suitably configured to scale the amplitude of the phase adjustment signal 412. The amplitude scaling ensures that the phase adjustment signal 412 and the reference output signal 414 are associated with the same amount of energy when the input signal and the clock signal are aligned. In the context of the example system described herein, the width of the phase reference pulse will be 50% greater than the width of the corresponding reference output pulse when the clock signal is aligned with the input signal. Thus, summer 454 is preferably configured to attenuate the amplitude of the phase adjustment signal 412 such that the energy contained in the phase reference pulse is approximately equal to the corresponding energy contained in the reference output pulse. In the foregoing example, the amplitude of the phase adjustment signal 412 is selected to be two-thirds the amplitude of the reference output signal 414.

In operation, if the phase adjustment signal 412 and the reference output signal 414 are associated with the same energy, then the clock is aligned and VCO 110 will maintain its current clock frequency (see FIG. 1). However, if the phase adjustment signal 412 contains more energy than the reference output signal 414, then VCO 110 will increase the clock frequency. Conversely, if the phase adjustment signal 412 contains less energy than the reference output signal 414, then VCO 110 will decrease the clock frequency.

Figure 7:
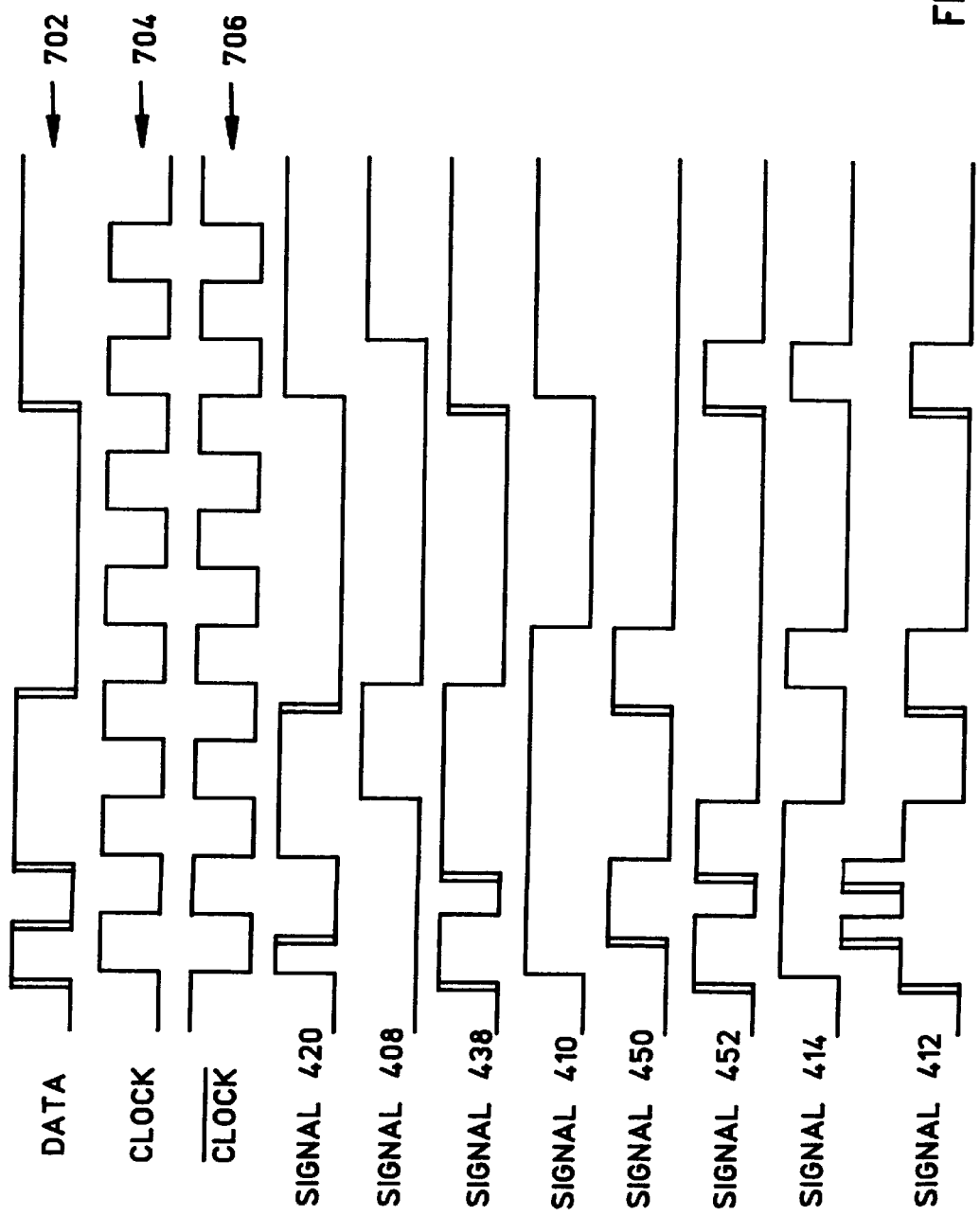

FIG. 7 illustrates a number of signals that may be generated by phase detector circuit 400 in response to an example data signal 702. Data signal 702 is depicted with various phase possibilities, thus resulting in different leading and trailing edge transition points, as discussed above. The various components of circuit 400 are clocked by the clock signal 704 or by the inverse clock signal 706. In FIG. 7, a number of signals are identified by the corresponding reference numbers shown in FIG. 4.

Signal 420, which is the output of latch 416, has defined low-to-high transitions because the data is well settled when latch 416 samples the data. The low-to-high transitions are aligned with respective low-to-high transitions of clock signal 706. However, the high-to-low transition points can include the various phase conditions because the high-to-low transitions in the data signal 702 occur while latch 416 is enabled. The same general characteristics apply to signal 438, which is the output of latch 434.

Signal 408, i.e., the output of latch 424, is a retimed signal having well-defined low-to-high and high-to-low transitions. In other words, signal 408 does not contain phase information associated with any transition point. All of the transitions in signal 408 are aligned with a low-to-high edge of inverse clock signal 706 (the transitions in signal 408 are also aligned with high-to-low edges of clock signal 704). Similarly, signal 410 is a retimed signal with its well-defined transitions aligned with low-to-high edges of clock signal 704.

The outputs of XOR gates 426 and 444 are respectively shown as signals 450 and 452. As described above, the high-to-low transitions in signals 450 and 452 are well-defined and aligned with clock signal 704 or inverse clock signal 706. However, the low-to-high transitions may reflect the different phase conditions associated with signals 420 and 438. As described above, signals 450 and 452 are preferably generated such that the pulses are wider than a clock pulse. This results in improved detector performance, particularly at very high speeds.

Reference signal 414 has well-defined transition points that are aligned with the transition points of the clock signals. Phase adjustment signal 412 represents a sum of signals 450 and 452. As mentioned above, the "overlap" between signals 450 and 452 can be utilized to convey the phase adjustment information for use by the VCO.

The present invention has been described above with reference to a preferred embodiment. However, those skilled in the art having read this disclosure will recognize that changes and modifications may be made to the preferred embodiment without departing from the scope of the present invention. These and other changes or modifications are intended to be included within the scope of the present invention, as expressed in the following claims.

What is claimed is:

1. A digital phase detector circuit comprising:
    a first latch having a first data input node configured to receive a digital input signal, said first latch being configured to generate a first digital output signal at a first data output node in response to said digital input signal and in response to a clock signal;
    a second latch having a second data input node configured to receive said first digital output signal, said second latch being configured to generate a second digital output signal at a second data output node in response to said first digital output signal and in response to an inverse clock signal;
    a third latch having a third data input node configured to receive said digital input signal, said third latch being configured to generate a third digital output signal at a third data output node in response to said digital input signal and in response to said inverse clock signal;
    a fourth latch having a fourth data input node configured to receive said third digital output signal, said fourth latch being configured to generate a fourth digital output signal at a fourth data output node in response to said third digital output signal and in response to said clock signal;
    a first exclusive OR (XOR) gate configured to receive said first digital output signal and said fourth digital output signal as inputs, said first XOR gate producing a first XOR output signal; and
    a second XOR gate configured to receive said second digital output signal and said third digital output signal as inputs, said second XOR gate producing a second XOR output signal.

2. A digital phase detector circuit according to claim 1, further comprising a processing circuit configured to generate a phase adjustment signal in response to said first and second XOR output signals.

3. A digital phase detector circuit according to claim 2, wherein said processing circuit comprises an analog summer.

4. A digital phase detector circuit according to claim 2, further comprising a voltage controlled oscillator associated with the generation of said clock signal and said inverse clock signal, said voltage controlled oscillator being responsive to said phase adjustment signal.

5. A digital phase detector circuit according to claim 1, further comprising a third XOR gate configured to receive said second digital output signal and said fourth digital output signal as inputs, said third XOR gate producing a reference signal.

6. A digital phase detector circuit according to claim 1, wherein said inverse clock signal is derived from said clock signal.

7. A digital phase detector circuit according to claim 1, wherein:
    said digital input signal has a data rate;
    said clock signal has a frequency in hertz equal to one half the data rate; and
    said inverse clock signal has a frequency in hertz equal to one half the data rate.

8. A digital phase detector circuit according to claim 7, wherein said data rate equals 10 Gbps and said frequency equals 5 GHz.

9. A digital phase detector circuit comprising:
    a first digital circuit element for retiming a digital input signal into a first retimed digital signal, said first digital circuit element being responsive to a clock signal;
    a second digital circuit element for retiming said first retimed digital signal into a first digital output signal, said second digital circuit element being responsive to an inverse clock signal derived from said clock signal;
    a third digital circuit element for retiming said digital input signal into a second retimed digital signal, said third digital circuit element being responsive to said inverse clock signal;

a fourth digital circuit element for retiming said second retimed digital signal into a second digital output signal, said fourth digital circuit element being responsive to said clock signal; and a fifth digital circuit element configured to produce a first phase reference component signal in response to said first retimed digital signal and in response to said second digital output signal.

10. A digital phase detector circuit according to claim 9, wherein said first, second, third, and fourth digital circuit elements each comprises a latch.

11. A digital phase detector circuit according to claim 9, further comprising a sixth digital circuit element configured to produce a second phase reference component signal in response to said second retimed digital signal and in response to said first digital output signal.

12. A digital phase detector circuit according to claim 11, further comprising an analog summer configured to generate a phase adjustment signal in response to said first and second phase reference components.

13. A digital phase detector circuit according to claim 12, further comprising a voltage controlled oscillator associated with the generation of said clock signal and said inverse clock signal, said voltage controlled oscillator being responsive to said phase adjustment signal.

14. A digital synchronization method comprising:

receiving a digital input signal comprising an input data pulse with a low-to-high transition edge and a high-to-low transition edge;

receiving a digital clock signal comprising a clock pulse having a low-to-high transition edge and a high-to-low transition edge; and generating a phase reference component signal comprising a phase reference pulse having a low-to-high transition edge substantially aligned with the low-to-high transition edge of said input data pulse, and having a high-to-low transition edge substantially aligned with the high-to-low transition edge of said clock pulse, said phase reference pulse having a width greater than or equal to the width of said input data pulse.

15. A method according to claim 14, wherein:

said digital input signal has a data rate; and said digital clock signal has a frequency in hertz equal to one half the data rate.

16. A method according to claim 14, wherein said generating step comprises:

generating, with a first latch, a first digital output signal in response to said digital input signal and in response to said digital clock signal;

generating, with a second latch, a second digital output signal in response to said first digital output signal and in response to an inverse digital clock signal derived from said digital clock signal;

generating, with a third latch, a third digital output signal in response to said digital input signal and in response to said inverse digital clock signal;

generating, with a fourth latch, a fourth digital output signal in response to said third digital output signal and in response to said clock signal; and processing said first and fourth digital output signals.

17. A method according to claim 16, wherein said processing step performs an exclusive OR function on said first and fourth digital output signals to generate said phase reference component signal.

18. A method according to claim 14, wherein said generating step comprises:

generating a first retimed digital signal from said digital input signal in response to said digital clock signal;

retiming said first retimed digital signal into a first digital output signal;

generating a second retimed digital signal from said digital input signal in response to an inverse digital clock signal derived from said digital clock signal;

retiming said second retimed digital signal into a second digital output signal; and processing said first retimed digital signal and said second digital output signal.

19. A method according to claim 18, wherein said processing step performs an exclusive OR function on said first retimed digital signal and said second digital output signal to generate said phase reference component signal.

20. A method for aligning a digital clock signal to a digital input signal, comprising:

generating a first retimed digital signal from said digital input signal in response to said digital clock signal;

generating a second retimed digital signal from said digital input signal in response to an inverse digital clock signal derived from said digital clock signal;

retiming said first retimed digital signal into a first digital output signal;

retiming said second retimed digital signal into a second digital output signal;

performing a first exclusive OR (XOR) function on said first retimed digital signal and said second digital output signal to produce a first phase reference component signal;

performing a second XOR function on said second retimed digital signal and said first digital output signal to produce a second phase reference component signal; and combining said first and second phase reference component signals into a phase adjustment signal.

21. A method according to claim 20, wherein said combining step is performed by an analog summer.

22. A method according to claim 20, further comprising the step of performing a third XOR function on said first and second digital output signals to produce a reference signal.

23. A method according to claim 20, further comprising the step of adjusting an output of a voltage controlled oscillator associated with the generation of said digital clock signal and said inverse digital clock signal, said adjusting step being responsive to said phase adjustment signal.

* * * * *